United States Patent [19]

Parker

[11] Patent Number: 4,726,661

[45] Date of Patent: Feb. 23, 1988

[54] FLEXIBLE RESISTIVE HEAT BATTERY TESTER AND HOLDER

[76] Inventor: Robert Parker, 411 Rolling La., Alamo, Calif. 94507

[21] Appl. No.: 848,025

[22] Filed: Apr. 3, 1986

Related U.S. Application Data

[63] Continuation-in-part of Ser. No. 723,329, Apr. 15, 1985.

[51] Int. Cl.4 .................. G02F 1/133; G01R 17/00
[52] U.S. Cl. ..................................... 350/351; 324/104
[58] Field of Search .............. 350/331 R, 336, 341, 350/351, 320; 340/815.01; 428/1; 324/96, 104, 106, 435, 437

[56] References Cited

U.S. PATENT DOCUMENTS

| 2,522,660 | 9/1950 | Bledsoe | 324/437 |
|---|---|---|---|
| 3,454,873 | 7/1969 | Abrahams | 324/437 |
| 3,600,060 | 8/1971 | Churchill et al. | 350/336 |
| 3,700,306 | 10/1972 | Cartmell et al. | 350/341 |
| 4,006,414 | 2/1977 | Parker | 350/351 |
| 4,022,706 | 5/1977 | Davis | 252/299.7 |
| 4,118,112 | 10/1978 | Thornburg | 350/351 |
| 4,173,733 | 11/1979 | Sugalski et al. | 340/815.01 |
| 4,360,780 | 11/1982 | Skutch | 324/437 |
| 4,457,589 | 7/1984 | Tamuro | 350/336 |
| 4,516,836 | 5/1985 | Ferrato | 350/336 |

FOREIGN PATENT DOCUMENTS

| 0126559 | 10/1979 | Japan | 350/334 |
|---|---|---|---|
| 0017531 | 1/1984 | Japan | 350/334 |
| 2117110 | 11/1983 | United Kingdom | 350/334 |

OTHER PUBLICATIONS

Wargin et al., "A Large, Flexible, Liquid Crystal Display Cell", IEEE Conference of 1972, Conference on Display Devices, N.Y., USA, 11-12 Oct. 1972.

Primary Examiner—Stanley D. Miller
Assistant Examiner—David Lewis
Attorney, Agent, or Firm—Shyamala T. Rajender

[57] ABSTRACT

A device for testing a battery, particularly a small, "button-type" battery, such as those used in hearing aids, calculators, watches and the like, comprising a flexible, transparent substrate on which is deposited a conductive material, which may taper outwardly in opposite directions or in a single direction, from a central point from one side to a pair of outer terminals. A layer of a cholesteric liquid crystal material is then deposited on the substrate. A layer or band of a black light absorbing material the opposite side from the black absorber layer. The conductive material is an epoxy cement-based conductor, preferably silver, printed or painted directly on to the substrate. An indicator scale is located along sections of the tapered conductive material. To test a dry cell battery, the terminal ends of the conductive material are placed in contact with the battery terminals, causing a current to flow which heats the conductive material, the heat generated being the most intense at the central point and radiating outwardly. The heat is transferred through the thin substrate to the liquid crystal layer which results in a color change in the liquid crystal. The traverse of the color change along the length of the indicator scale, outwardly from the center point, is proportional to the current or voltage output or the condition of the battery to be tested and can be read on the indicator scale which is calibrated accordingly.

24 Claims, 6 Drawing Figures

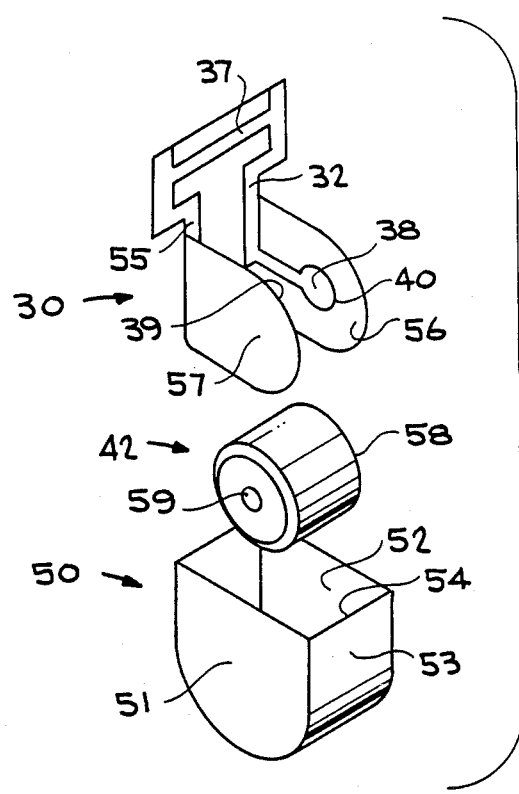
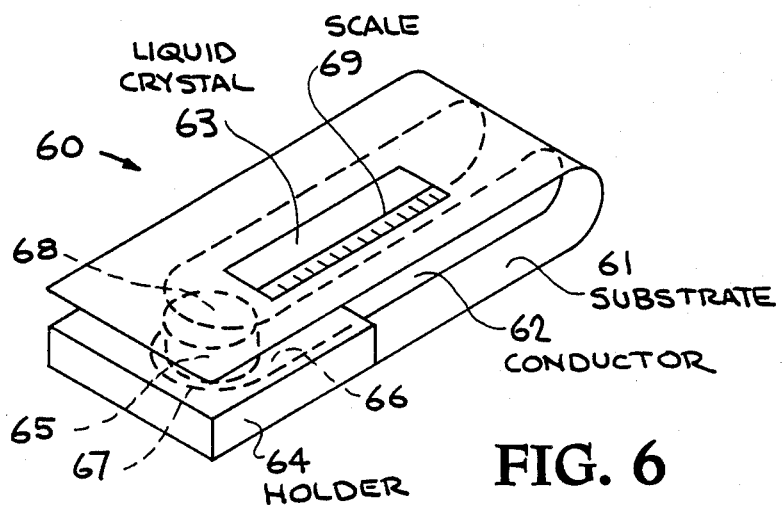

FLEXIBLE RESISTIVE HEAT BATTERY TESTER AND HOLDER

RELATED APPLICATIONS

This is a continuation-in-part application of U.S. application Ser. No. 723,329, filed Apr. 15, 1985.

BACKGROUND OF THE INVENTION

This invention relates to battery testers, particularly to a tester for small, button-type batteries, such as those used in hearing aids, watches, calculators and the like, and more particularly to very simply constructed, inexpensive, button-type battery tester with no moving parts, whereby a small battery can be readily tested.

The extent of the use of small batteries, particularly dry cell batteries, has increased rapidly and steadily during the last decade, and a substantial effort has been directed to the production of recharging devices for such batteries, as well as providing means for testing the strength or condition of the batteries. Batteries are often stored prior to use and in many instances are discarded for new ones without determining the existing strength or condition of the batteries, thereby resulting in a substantial waste of useful battery life.

A few battery testers and indicating devices are known in the prior art but they are bulky, cumbersome or expensive, use complex electric or electronic components and circuitry and are designed mostly for large lead-acid type batteries used in the powering of transmitters, receivers, servos and the like.

Some of these indicating devices or their components are exemplified in the following patents:

U.S. Pat. No. 4,006,414 issued Feb. 1, 1977 to Robert Parker; U.S. Pat. No. 3,974,441 issued Aug. 10, 1976 to Johannes Van Den Haak; U.S. Pat. No. 4,022,706 issued May 10, 1977 to Frederick Davis; U.S. Pat. No. 4,290,021 issued Sept. 15, 1981 to Jacob J. Thereon; U.S. Pat. No. 4,066,897 issued Jan. 3, 1978 to Ralph L. Belcher; U.S. Pat. No. 3,600,060 issued Aug. 17, 1971 to Donald Churchill; and U.S. Pat. No. 4,360,780 issued Nov. 23, 1982 to William G. Skutch, Jr.

The copending U.S. application Ser. No. 723,329, filed Apr. 15, 1985 provides a simply constructed efficient tester for 1.5 v and 9.0 v dry cell batteries, such as the conventional AAA, AA, C and the D types.

The foregoing status of the art indicates that a need still exists in this field for an inexpensive and simple device or means for readily testing the charge state or condition of small batteries, such as those utilized in hearing aids, watches, calculators and the like, before deciding to discard them and install new ones at the time of contemplated use.

Tiny or "button-type" batteries, such as those used in hearing aids, watches, pocket calculators and the like are too small for many users and distributors to handle, particularly senior citizens and thus the testing of these small batteries require a certain amount of manual dexterity which is very difficult or impossible for many users. Even the simple tester of the type described and claimed in the copending U.S. application indentified herein, would be difficult to utilize for these small batteries because of their small size and the lack of sufficient manual dexterity which renders use of even such a simple tester difficult to manage at best. Thus a need has existed for a tester which is both simple in construction and which enables ready testing of these small sized batteries.

SUMMARY OF THE INVENTION

The present invention fills the above mentioned need by providing an effective device for readily testing small, dry-cell type batteries such as those used in hearing aids, watches, pocket calculators and the like and which at the same time lends itself to simple and inexpensive fabrication thereof.

Therefore, it is an object of the present invention to provide a means for testing batteries, particularly, small, button-type, dry cell batteries.

A further object of the invention is to provide a battery tester which can be readily used by purchasers of small, portable batteries.

Another object of the invention is to provide a battery tester which basically consists of a conductive material deposited in a specific pattern on one side of a substrate and a layer of a cholesteric crystal material is carried on the opposite side of the substrate, such that current flowing through the conductive material produces a temperature gradient, which in turn causes a color change or a line delineation in the cholresteric liquid crystal material, the distance traversed by the color change or the length of the line being proportional to the strength of the battery.

Another object of the invention is to provide a tester for small dry cell batteries such as those utilized in hearing aids, watches and pocket calculators and the like.

Another object is to provide a battery tester which enables a user to test batteries which are too small to be readily handled by an ordinary user.

Additional objects, advantage and novel features of the invention, together with additional features contributing thereto and advantages accruing therefrom will be apparent from the following description and the accompanying illustration of various embodiments of the invention as described hereinafter. The objects and advantages of the invention may be realized and attained by means of the instrumentalities and combinations particularly pointed out in the appended claims.

In accordance with the foregoing objects of the invention, one embodiment of the battery tester basically consists of a flexible, preferably transparent substrate or film on which is deposited a layer of a dark, light absorbing material, and, on top of the absorber, a layer of a conductive material, such as silver, nickel or carbon in a binder base such as epoxy or urethane, in at least a configured pattern, and which terminates in or has connected to the pattern, a pair of opposite ends or terminals for contacting the terminals of a battery, such as a dry cell battery, to be tested. A microencapsulated cholesteric liquid crystal layer is deposited on the other side of the substrate.

In one preferred embodiment, the thin film of a black, light absorbing or "backing" material is omitted. A conductive material comprising epoxy or urethane based silver, nickel or carbon granules or powder is deposited on a transparent substrate or film so as to form a pattern having terminal end portions. The pattern may, for example, be of a bow-tie or wedge shaped configuration, as described and claimed in the copending U.S. application identified above, or the pattern may be of a straight line configuration as illustrated. A layer of a microencapsulated cholesteric liquid crystal is then deposited on the other side of the substrate. The battery to be tested is placed in a flexible container, constructed of polyethylene, plastic, cardboard and similar material. Then the terminal end portions of the conductive material, which is inserted in the flexible container, contact the terminals of a battery, whereby a current is made to flow through the conductive material, generating heat in the conductor. The heat is then transferred through the substrate to the liquid crystal causing a change in its color. The color change in the liquid crystal may be rendered more readily visible or discernible by providing a black, light absorbing, backing material behind the liquid crystal material. The black backing material may consist of dark paint such as black latex or uv curing paints. To protect the conductive pattern, a suitable protective coating may be deposited on all areas of the pattern except the terminals or contact points. The protective material may be any uv curing paint.

For testing a small, hearing aid battery, for example, the adjacent terminals of the battery are placed in contact with the terminal ends of the conductive pattern for the one embodiment, whereas in other embodiments, the battery is placed in the container and the flexible substrate is wrapped around the battery such that the terminal ends of the pattern contact the opposite terminal ends of the battery.

As described in the copending application U.S. Ser. No. 723,329, when a current passes through the conductive material pattern, in a wedge or bow-tie configuration, a temperature gradient is generated beginning at the center point of the wedge or "bow-tie" and radiates towards the terminal ends. The heat generated is transferred through the substrate to the liquid crystal layer which changes color starting at a point corresponding to the central point of the bow-tie configuration of the conductor, moving farther towards the rounded edges of the bow-tie pattern. The farther the outward displacement of the color change, the greater is the voltage output or the strength of the battery being tested. A calibrated scale, indicating a relationship between voltage or current vs. distance traveled, is located along the bow-tie pattern such that color changes in the liquid crystal corresponding to only the central section of the conductive material indicates a weak battery while color changes in the liquid crystal corresponding to a length beyond the central section and beyond or through the entire length of the pattern indicates a good to a strong battery condition.

BRIEF DESCRIPTION OF THE DRAWINGS

FIG. 5 illustrates one preferred embodiment of the battery tester of the present invention which utilizes a flexible holder or contaienr for holding the battery and may omit the use of the layer of light absorbing material.

FIG. 6 illustrates another embodiment of the present invention which utilizes a battery holder which is secured to the substrate of the tester.

DETAILED DESCRIPTION OF A PREFERRED EMBODIMENT

Figure 1:
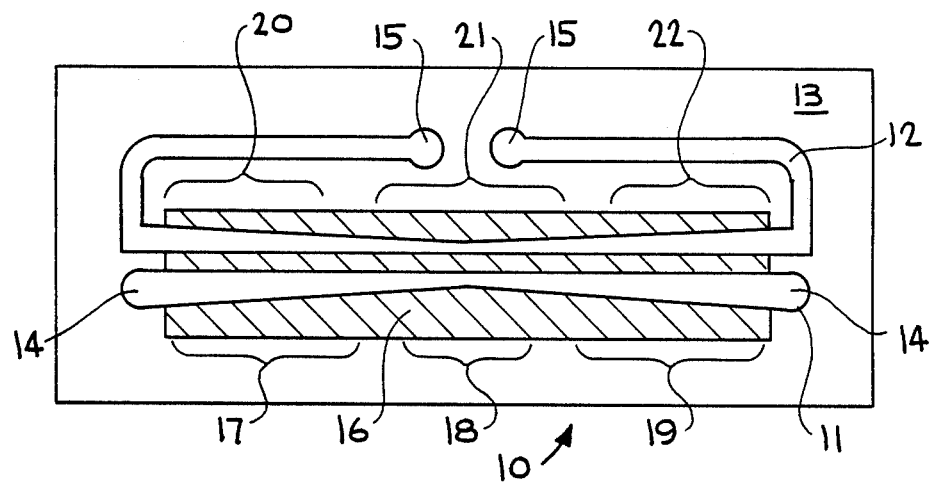
FIGS. 1 and 2 illustrate an embodiment of a prior known tester for 1.5 v and 9 v batteries, with the tester wrapped around a 1.5 v battery for testing the same.
Figure 2:
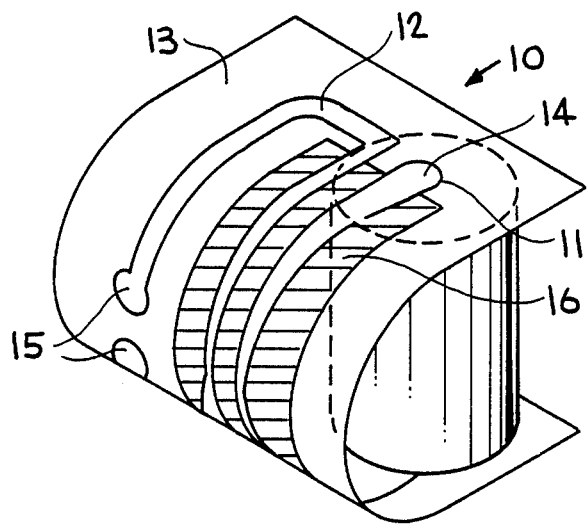

The present invention involves a device for testing small, dry cell, "button-type" batteries, such as those utilized in hearing aids, watches and pocket calculators and the like, which have terminals or contact points on opposite ends of the battery. Basically, the battery tester is similar to that described and claimed in the above referenced U.S. application Ser. No. 723,329, and involves depositing a pattern of electrically and thermally conductive material on a substrate. The pattern may be in the form or configuration of a double wedge or "bow-tie" (tapering from a small central point outwardly in opposite directions) with each outer end terminating in or connected to a point of contact to which a terminal of a battery to be tested is placed in contact, as illustrated in FIGS. 1 and 2. The conductive material may be epoxy based silver, nickel or carbon. The tester may additionally include an absorber or backing band or strip deposited on the substrate, preferably on the same side of the substrate as the conductive pattern. A layer of a microencapsulated cholesteric liquid crystal material is deposited on the opposite side of the substrate from the conductive layer or pattern. As used herein, the terms "cholesteric liquid crystal" and "liquid crystal" are used interchangeably throughout this description and refer to the same liquid crystal materials disclosed and claimed herein. An indicator scale can also be located along the length of the "bow-tie" shaped pattern, since the liquid crystal material changes color in a direction corresponding to the current flowing in the conductive pattern, starting at a point corresponding to the central point of the pattern. The greater the displacement of the color change from the central point, the greater is the current flow, which is proportional to the strength or condition of the battery. The dark or black backing material or backer, when used, makes the color change easily observable and may be derived from any dark paint such as a black latex or uv curing paint. Other paints or coating materials are also suitable. A suitable protective coating may be optionally applied over the conductive pattern except at the terminal ends thereof, to protect it from wear and tear, and to ensure correct placement of the tester contacts on the battery terminals.

The conductive material pattern need not be in a "bow-tie" configuration as illustrated in FIG. 1, may be of a straight line configuration or a single wedge shape. In this configuration, the color change in the liquid crystal material would start at one end of the pattern and move towards the other end. The greater the distance of color traverse, the greater the strength or charge of the battery.

Cholesteric liquid crystals are chosen as the indicating materials because of the brilliant iridescent colors they exhibit when exposed to changes in temperature, pressure and electric fields. Cholesteric liquid crystal materials suitable for use in the subject invention include but are not limited to cholesteryl chloride, cholesteryl oleyl carbonate, cholesteryl bromide, cholesteryl acetate, cholesteryl nanoate, cholesteryl oleate, cholesteryl caprylate, and the like. In addition, all the cholesteric liquid crystals disclosed and listed in U.S. Pat. Nos. 4,022,706 and 3,600,060 are incorporated herein by reference and made a part hereof, as being suitable for use in the subject invention.

Referring now to the drawings, FIGS. 1 and 2 illustrate an embodiment of a battery tester described and claimed in copending U.S. application Ser. No. 723,329, which was directed primarily to testers for 9.0 v batteries which have terminals on the same end and 1.5 v batteries, such as the AAA, AA, C and D types, having terminals on opposite ends. The following description of the embodiment shown in FIGS. 1 and 2 is provided to establish a better understanding of the prior tester and to set forth the background for the small, battery tester of the subject invention, whereby batteries which cannot be reasonably handled by many ordinary users due to their small size, can be readily tested by the user.

FIG. 1 illustrates an embodiment of the prior battery tester, generally indicated at 10, which utilizes two separate conductive material patterns 11 and 12 which are deposited on a transparent substrate or film 13 composed, for example, of transparent, high temperature stable, film or support of polyester (such as Dupont's mylar), polycarbonate, polyamide, polysufone, paper, preferably, fiber or nylon enforced, cellulose, laminates and the like. Other high-temperature stable polymers are equally suitable.

The film 13 is preferably transparent so that the user can easily match the terminal ends or contacts 14 and 15 of the conductive pattern 11 or 12 with the terminals of the battery being tested, as shown in FIG. 2. The film, for example, may vary in thickness from about 0.001 inch, with a preferred thickness of about 0.002 to 0.005 inch. Film of a thickness less than about 0.001 inch would be too insubstantial to be operative satisfactorily, for testing the condition of batteries, while a film thicker than about 0.010 inch would result in longer response times (because the time required for the battery tester to reach thermal equilibrium would then be greater than 5-10 seconds) and consequent loss of the observed color change.

The conductive material forming patterns 11 and 12 is deposited on the film or substrate 13 by printing, coating, painting or other conventional depositing techniques. This conductive material may be epoxy based silver, nickel or carbon and may be in the form of a conductive "ink". Silver is the most preferred conductor. Epoxy or urethane based silver, nickel or carbon and the like are materials of choice. The tester tests the battery under a resistive load similar to that in its normal operational uses.

As shown in FIG. 1, substrate 13 is also provided with a plurality of scale sections or segments located adjacent the edges of an absorber or backer layer 16, as indicated at 17, 18 and 19 for conductive pattern 11 and at 20, 21 and 22 for conductive pattern 12. These scale segments may be deposited directly onto substrate 13. The area of the patterns 11 and 12 indicated by center scale segments 18 and 21 indicate a weak, "bad" or low battery, while the outer segments 17 and 19 or 20 and 22 indicate a strong, "good" or charged battery. For example, the center scale segments 18 and 21 may be colored red, with the outer scale segments being colored green to correspond to the conventional battery test color codes. The scale sections indicated in the embodiment of FIG. 1 may be replaced with a continuous scale from center points of the patterns to a selected outer point and be marked or calibrated from 0 volts at the center point to the full voltage, such as 1.5 or 9.0, at the outer point, and if desired, the scale may be colored gradually progressing from, for example, a bright red at the center point to a bright green at the outer point.

With the above background information which sets forth the basic construction and principal operational features of the battery tester of the present invention, attention is now directed to the embodiments illustrated in FIGS. 3-6, which constitute the present invention directed to testers for very small, or tiny "button-type" batteries, such as those utilized in hearing aids, watches, pocket calculators and the like, which are generally of a flat, round configuration with a terminal or contact on opposite sides. Due to the small size of these batteries, they are very difficult and awkward for most users to handle. Thus, testing of these batteries has been difficult, if not impossible for many users, especially many senior citizens. The present invention provides a mechanism which would enable most users to test these small, button-type batteries.

Figure 3:
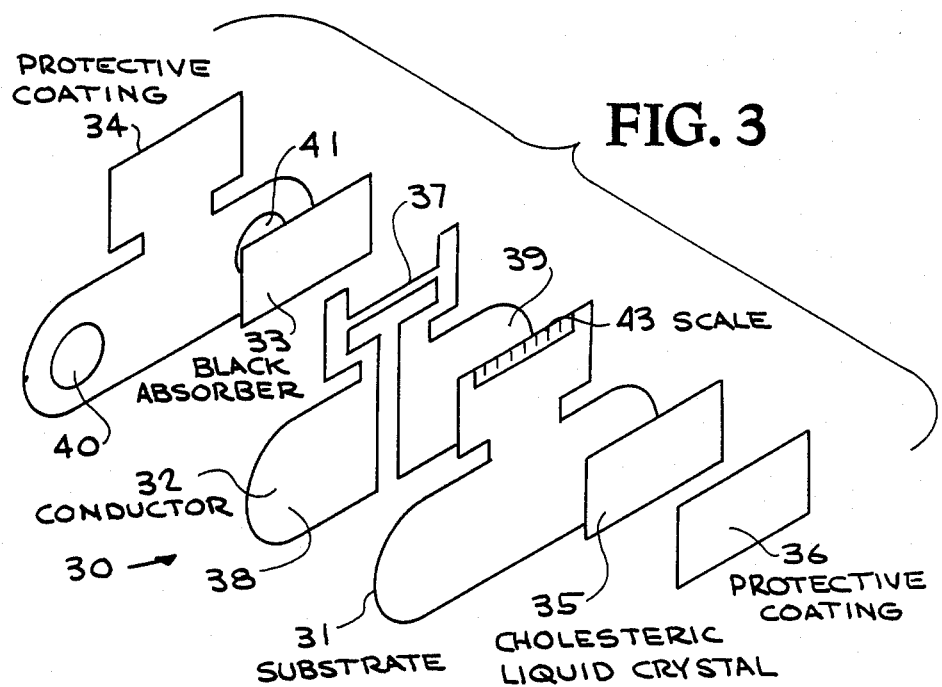
FIG. 3 is an exploded view of a battery tester for small, dry cell "button-type" batteries made in accordance with the present invention.
Figure 4:
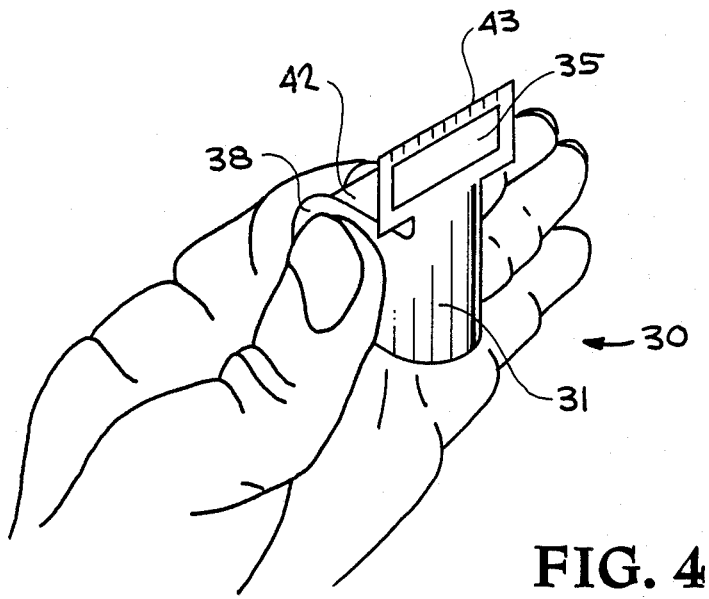
FIG. 4 illustrates the embodiment of the subject battery tester of FIG. 3 positioned to test a battery; this embodiment utilizes a layer of light absorbing material on top of the conductive material, as in the tester illustrated in FIG. 1.

Referring first to FIG. 3, an embodiment of a small battery tester is illustrated in an exploded view, this embodiment being shown in use in FIG. 4. The basic components and materials of the FIG. 3 tester are generally similar to those described above with respect to FIG. 1, and these same materials may be utilized as needed in the tester illustrated in FIG. 3. As shown, the tester generally indicated at 30, consists of a flexible substrate 31, having on one side thereof a layer or pattern of conductive material 32, a layer of backer or absorber material 33 and a protective coating or layer 34, and on the opposite side of substrate 31 is a layer or pattern of cholesteric liquid crystals 35 and a protective coating or layer 36 covering layer 35. The substrate 31 is configured to have a body section and a pair of outwardly extending wing sections. Note that absorber layer 33 is configured similar to crystal layer 35 and layer 33 functions to provide clearer or more easily discernible color change in the layer 35 as described above. As the current flows through the small cross-section 37 of the conductive layer 32, when the battery terminals are placed in contact with terminal points 38 and 39 of the conductive layer, as shown in FIG. 4. Note also that protective layer or coating 34 is provided with a pair of openings 40 and 41 which cooperate with a contact points 38 and 39, so as not to cover the conductive material at the contact points, to ensure better electrical connection between conductor layer 32 and battery 42. A scale 43 may be deposited on substrate 31 adjacent the liquid crystal layer 35 to provide readout of the battery condition as discussed above. The small cross-section 37 of conductive layer 32 may be of a straight line configuration as shown, or of a single-wedge or double-wedge ("bow-tie") configuration.

As seen in FIG. 4, a small battery 42 to be tested is placed between the wing sections of substrate 31 and between the contact points 38 and 39 of conductive material pattern or layer 32 deposited on the wing section of flexible substrate 31, and the contact points are held on the terminals of battery 42 by the finger pressure of the person testing the battery. This allows current flow through the conductive pattern 32 and cross-section 37 thereof causing heating of the liquid crystal layer 35 and the consequent change in color of the layer 35, proportional to the condition of the battery, as described above.

While various techniques may be used to fabricate the embodiment of the battery tester illustrated in FIG. 3, the following is a description of the fabrication process or method utilized to construct the battery tester for experimental purposes for verifying the operability of the invention. The method consists of the following operational steps:

(a) forming a substrate 31 of the desired dimensions from a piece of material such as polyester, plastic, polyamide, cardboard or polycarbonate which is transparent and flexible;

(b) depositing (printing or coating) on one side of the substrate, a layer or coating 35 of a microencapsulated liquid crystal material. This may be accomplished using a template cut out to the required or desired pattern or dimensions or may be silk-screen or off-set printed on the substrate;

(c) depositing (printing or coating) a layer or pattern 32 of a conductive material on substrate 31, such that it is positioned or aligned relative to the liquid crystal layer 35. This may be accomplished using a template cut out to correspond to the desired shape and dimensions of the conductive pattern 32. Alternatively, the conductive pattern may be deposited on the same side as the liquid crystal layer, with the absorber layer 33 sandwiched between the pattern and the liquid crystal layer, i.e., the absorber layer is deposited over the the liquid crystal layer before the conductive pattern is deposited over the absorber layer;

(d) depositing a layer or band 33 of a black backer or absorber material such as black latex or uv curing paint, of a desired length and width on the other or opposite side of substrate 31 over a portion of conductive layer 32, particularly section 37. This may be done using a template cut out to correspond to the desired shape and dimensions or may be silk screen or off set printed on the substrate material;

(e) depositing (printing or coating) a scale 43, on the substrate 31 adjacent and along the length of the liquid crystal layer 35. Templates with appropriate cut out patterns for the scale segments may be used;

(f) depositing (printing or coating) protective nonconductive films 34 and 36 over the areas of the conductive patterns 32 and absorber layer 33, and optionally, over the liquid crystal layer 36, using materials such as uv curing paints. This provides environmental and insulative protection for the pattern 32.

In fabricating the battery tester, the above process may be modified such that the absorber layer 33 is coated directly on to the substrate 31 and conductive pattern 32 is printed, painted or coated over the black absorber or backer layer 33 such that the terminal ends extend beyond the layer 33. In addition, the width of the absorber layer 33 may be enlarged from that shown in FIG. 3 such that it covers a larger segment of conductive pattern 32. The backer or absorber layer 33 may be made narrow enough to delineate a sharp vertical or horizontal line as the liquid crystal material changes color when it is heated by the conductive pattern as the current passes therethrough.

While the foregoing sequence of steps is preferred, such sequence is neither crucial nor necessary for the operation or practice of the present invention. Alternatively, the liquid crystal, absorber, conductive patterns and the protective coating may all be located on the same side of the substrate. For instance, in one embodiment, a layer 35 of the liquid crystal is initially deposited on the substrate 31, followed by a layer 33 of the absorber. The conductive pattern 32 is then deposited on top of the absorber and then coated with the insulating protective coating.

The embodiment of the small "button-type" battery tester illustrated in FIG. 5 is identical to that of the FIG. 4 embodiment, except that a holder or container 50 is utilized to house or hold battery 42 while being tested. The embodiment is particularly useful in testing very small batteries and for users or distributors who have less manual dexterity and therefore are unable to hold the battery and the tester simultaneously within their fingers. The holder or container 50 is constructed out of plastic, polycarbonate, polyethylene, polyamide or other flexible, nonconductive material, such that sides 51 and 52 thereof can be flexed or pressed inwardly to produce a firm, solid contact between the terminals of battery 42 and the electrical conductive layer 32 of tester 30. The holder 50 also includes a curved interconnecting section 53 such that sides 51 and 52 are integral with or secured to section 53 to form a curved container having an open end 54. The curvature of holder 50, in this embodiment corresponds to the curvature or contour of battery 42, but may be of another configuration which will enable the entry into and retention therein of a battery to be tested.

Tester 30, as shown in FIG. 5, has a body section 55 and a pair of outwardly extending wing or flange-like sections 56 and 57 which contain contact points 38 and 39 of conductor 32 with openings 40 and 41 in protective coating 34 to provide electrical contact between the terminals or contacts 58 and 59 of battery 42, only contact point 38 and opening 40 being shown in FIG. 5. Again, as in FIG. 4, section 37 of the conductive layer 32 may also be of a single-wedge or double-wedge ("bow-tie") configuration. To test battery 42 with the tester illustrated in FIG. 5, the battery is positioned in holder 50 and the tester 30 is positioned in the holder such that wing sections 56 and 57 extend into holder 50 between the battery and the sides 51 and 52 of holder 50. By pressing sides 51 and 52 inwards, electrical contact is made between contact points 38 and 39 of tester 30 and terminals 58 and 59 of battery 42. This produces a current through conductor layer 32 causing heating of the liquid crystal layer 35 located opposite conductor section 37, as seen in FIG. 4, and a change in color of layer 35 proportional to the condition of battery 42, as described above.

By way of example, the holder or container 50 may be constructed out of cardboard, polyethylene, polyamide, polycarbonate and the like and may be formed by any known method. In the embodiment illustrated in FIG. 5, the sides 51 and 52 of holder 50 may be constructed of polyethylene, polycarbonate, or paper, and with any convenient dimensions. While the sides 51 and 52 and the section 53 may be made from the same material with the same thickness, the interconnecting section 53 may be of a different thickness and of a different material, if desired. The size of holder 50 will vary depending on the size of the battery being tested, the only size requirement being that the dimensions should enable the sides of the holder to be pressed inward against the wing sections of the tester so as to produce good electrical contact with the terminals of the battery being tested.

FIG. 6 illustrates another embodiment of a small battery tester wherein the battery holder is integral with or secured to the support substrate of the tester, the substrate being bent or wrapped back on itself to provide contact between the battery terminals and corresponding color change in the liquid crystal layer of the tester.

As shown in FIG. 6, the tester 60 basically consists of a substrate 61, an electrical conductor 62, a quantity of or layer of liquid crystals 63, and a holder 64 for battery 65. The holder 64 has an opening 66 therein for retaining battery 65, and one end or contact point 67. The electrical contact point of conductor 62 is located in opening 66 to provide electrical contact between one terminal of battery 65 and conductor 62. Conductor 62 is secured to or deposited on one side of substrate 61, for example, and has an opposite end or contact point 68 located so as to be in electrical contact with the opposite terminal of battery 65. The liquid crystal layer 63 is secured to or deposited on the opposite side of conductor 62 adjacent the end or contact point 68. The electrical conductor 62 may, if desired, include an area of reduced cross-section adjacent liquid crystal 63, as in the embodiments illustrated in FIGS. 4 and 4. That cross-sectional area of conductor 62 may be wedge-shaped as described above. Also, if desired, a layer of absorber material may be utilized on substrate 61 as described above.

To operate the tester illustrated in FIG. 6, a battery 65 is placed in holder 64 and substrate 61 is bent or pressed together to the position shown to provide contact between the battery terminals and the contact points of conductor 62 to produce a flow of current through the conductor thereby causing heating of and color change in the liquid crystal layer 63, proportional to the condition of the battery being tested as described above. If desired, an indicator scale 69 can be added to substrate 61 adjacent liquid crystal layer 63, which is designed to show the condition or charge state of the battery. In addition, a protective layer or coating may be applied or placed over conductor 62 except at contact points 67 and 68, and over liquid crystal layer 63, as described above.

Substrate 61 may have any convenient dimensions, and constructed of polyethylene, polypropylene, polyamide, polycarbonate and the like. The holder 64 may be made of plastic, cardboard, or any flexible material and of any suitable dimensions. Construction and positioning of the conductor 62, liquid crystal layer 63 and scale 69 on substrate 61 may be similar to that described above relative to the embodiments illustrated in FIGS. 4 and 5.

It has thus been shown that the present invention provides a device of simple construction which yet provides an effective, inexpensive, completely portable and simple means for testing the condition or voltage output of small. portable dry cell batteries such as for example those used in hearing aids, watches, pocket calculators and the like. The invention, thus, fills the need which has existed in the art of battery testing devices for these very small batteries.

The foregoing description of the embodiments of the invention has been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A battery tester for dry cell batteries, particularly adapted for "button-type" batteries, in which the passage of electrical current from an associated battery being tested causes color change in the tester proportional to the electrical energy of the battery being tested, said battery tester comprising:

a flexible substrate having a body section and a pair of oppositely located outwardly extending wing sections having a different width than said body section, said pair of wing sections being constructed so as to bend with respect to said body section and toward one another, a pattern of electrically conductive material positioned on said substrate and which extends across said body section of said substrate and has a terminal end point on each of said pair of wing sections of said substrate, and a quantity of cholesteric liquid crystal material positioned on said body section and in alignment with a section of said pattern of electrically conductive material, said crystal material being of the type which changes color upon heating thereof, whereby upon bending at least said pair of wing sections of said substrate and placing said terminal end points of said pattern of electrically conductive material on opposite terminals of an associated battery to be tested, electrical current flows through said conductive material causing a heating and color change of said liquid crystal material proportional to the electrical energy of an associated battery being tested.

2. The tester of claim 1, additionally including a layer of absorber material positioned on said substrate so as to be behind said liquid crystal material.

3. The tester of claim 1, additionally including a scale positioned on said substrate adjacent said liquid crystal material for providing a read out corresponding to the measure of change in color of the liquid crystal material.

4. The tester of claim 1, additionally including a protective coating positioned over at least the pattern of electrically conductive material except at the terminal end points thereof.

5. The tester of claim 1, wherein said pattern of electrically conductive material includes a portion of reduced cross-section located adjacent said liquid crystal material.

6. The tester of claim 5, wherein said portion of reduced cross-section is selected from the group of configurations consisting of a straight line, a single wedge or a double wedge.

7. The battery tester of claim 1, wherein the liquid crystal material is located on one side of said substrate and said patterns of conductive material is located on an opposite side of said subtrate.

8. The tester of claim 1, wherein said substrate is constructed of flexible, transparent material.

9. The teste of claim 8, wherein said flexible, transparent material is selected from the group of materials consisting of paper and polymers consisting of polycarbonate, polysulfone, polyester, cellulose and polyamide.

10. The battery tester of claim 1, wherein said liquid crystal material is selected from the group consisting of cholesteryl chloride, cholesteryl oleyl carbonate, cholesteryl bromide, cholesteryl acetate, cholesteryl nanoate, cholesteryl oleate, and cholesteryl caprylate.

11. The tester of claim 1, in combination with a holder for retaining an associated battery to be tested, said pair of wing sections of said substrate being constructed so that end portions thereof can be inserted into said holder, whereby contact of said terminal end points of said pattern of conductive material, located on said end portions of said pair of wing sections, with terminals of an associated battery retained in said holder causes flow of electrical current through said conductive material and heating and color change of said liquid crystal material.

12. The combination of claim 11, wherein said holder includes a pair of flexible side sections, said pair of wing sections of said substrate being positioned in said holder so as to be adjacent said flexible side sections of said holder, whereby pressing of said flexible side sections of said holder toward each other causes said terminal end points on said pair of wing sections of said substrate to contact terminals of an associated battery retained in said holder, causing heating and color change of said liquid crystal material.

13. The combination of claim 11, wherein said holder is positioned on said substrate.

14. A battery tester for dry cell batteries, particularly adapted for "button-type" batteries, in which the passage of electrical current from an associated battery being tested causes color change in the tester proportional to the electrical energy of the battery being tested, said battery tester comprising:

a holder for retaining an associated battery to be tested, said holder being unattached to said tester and having a pair of flexible side sections, said tester including:

a flexible substrate having a body section and a pair of outwardly extending wing sections having a different width than said body section, a pattern of electrically conductive material positioned on said substrate which extends across said body section of said substrate and has a terminal end point on each of said pair of wing sections of said substrate, and a quantity of cholesteric liquid crystal material positioned on said body section and in alignment with a section of said pattern of electrically conductive material, said crystal material being of the type which changes color upon heating thereof, whereby upon bending at least said pair of wing sections of said substrate and placing said terminal end points of said pattern of electrically conductive material on opposite terminals of an associated battery to be tested, electrical current flows through said conductive material causing a heating and color change of said liquid crystal material proportional to the electrical energy of an associated battery being tested.

15. The tester of claim 14, wherein said holder has a bottom section configured to cooperate with a configuration of an associated battery to be retained therein for testing.

16. The tester of claim 14, wherein said holder is constructed of a material selected from the group consisting of plastic, vinyl, cardboard and cloth.

17. A tester for "button-type" dry cell batteries, such as those utilized in hearing aids, watches, and calculators, which utilizes material that changes color when electrical current from an associated battery being tested passes therethrough, said tester consisting of:

a holder for retaining an associated "button-type" battery to be tested, and a tester assembly unattached to said holder including:
a flexible substrate,
a pattern of electrically conductive material having a pair of spaced apart end terminals positioned on one side of said substrate, and
a quantity of liquid crystal material positioned on an opposite side of said substrate so as to be in alignment with a section of said pattern of conductive material;

said tester assembly cooperating with said holder such that said flexible substrate can be bent so that said end terminals of said pattern of conductive material contact opposite terminals of an associated battery retained in said holder when pressure is applied to said substrate and said holder to cause current to flow through said pattern of conductive material which causes heating and change of color of said liquid crystal material.

18. The tester of claim 17, wherein said holder comprises a pair of flexible side sections and an interconnecting section defining a bottom of said holder.

19. The tester of claim 18, wherein said pair of flexible side sections include a curved portion and the interconnecting section includes a cooperating curved portion configured to fit the contour of an outer surface of an associated battery to be tested.

20. The tester of claim 17, wherein said liquid crystal material is selected from the group consisting of cholesteryl chloride, cholesteryl oleyl carbonate, cholesteryl bromide, cholesteryl acetate, cholesteryl nanoate, cholesteryl oleate, and cholesteryl caprylate.

21. The tester of claim 17, wherein said pattern of electrically conductive material is formed of a binder base and a material selected from the group consisting of silver, nickel and carbon.

22. A tester for "button-type" dry cell batteries, such as those utilized in hearing aids, watches, and calculators, which utilizes material that changes color when electrical current from an associated battery being tested passes therethrough, said tester consisting of:

a holder for retaining an associated "button-type" battery to be tested, and a tester assembly, said tester assembly including:
a flexible substrate,
a pattern of electrically conductive material having a pair of spaced apart end terminals positioned on one side of said substrate, and
a quantity of cholesteric liquid crystal material positioned on an opposite side of said substrate so as to be in alignment with a section of said pattern of conductive material;

said holder comprising a block of material having an opening therein, said holder being positioned on one end of said substrate of said tester assembly such that one of said pair of end terminals of said pattern of conductive material is located in said opening of said block;

said tester assembly cooperating with said holder such that said flexible substrate can be bent so that said end terminals of said pattern of conductive material contact opposite terminals of an associated battery retained in said holder when pressure is applied to said substrate and said holder to cause current to flow through said pattern of conductive material which causes heating and change of color of said liquid crystal material.

23. The tester of claim 22, wherein said substrate of said tester assembly has an elongated configuration with said one of said pair of end terminals of said pattern of conductive material being located adjacent one end of said substrate and another of said pair of end terminals of said pattern of conductive material being located adjacent an opposite end of said substrate.

24. The tester of claim 23, wherein said liquid crystal material is located so as to be in near but spaced relation with said opposite end of said substrate.

* * * * *